(12) United States Patent
Fillion et al.

(10) Patent No.: US 6,507,113 B1
(45) Date of Patent: Jan. 14, 2003

(54) ELECTRONIC INTERFACE STRUCTURES AND METHODS OF FABRICATION

(75) Inventors: Raymond Albert Fillion, Niskayuna, NY (US); Robert John Wojnarowski, Ballston Lake, NY (US); Ronald Frank Kolc, Cherry Hill, NJ (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/443,410

(22) Filed: Nov. 19, 1999

(51) Int. Cl.[7] .................. H01L 23/48; H01L 23/52; H01L 29/40
(52) U.S. Cl. ................. 257/737; 257/759; 257/40; 257/700
(58) Field of Search ................. 257/737, 759, 257/40, 700

(56) References Cited

U.S. PATENT DOCUMENTS

| | | | | |
|---|---|---|---|---|
| 4,221,047 A | * | 9/1980 | Narken et al. | 29/840 |
| 5,527,741 A | | 6/1996 | Cole et al. | 438/107 |
| 5,900,674 A | | 5/1999 | Wojnarowski et al. | 257/774 |
| 5,938,452 A | | 8/1999 | Wojnarowski et al. | 439/67 |
| 5,984,691 A | * | 11/1999 | Brodsky et al. | 439/91 |
| 6,025,730 A | * | 2/2000 | Akram et al. | 324/758 |
| 6,133,639 A | * | 10/2000 | Kovac et al. | 257/778 |
| 6,188,301 B1 | * | 2/2001 | Kornrumpf et al. | 333/262 |
| 6,246,249 B1 | * | 6/2001 | Fukasawa et al. | 324/765 |

FOREIGN PATENT DOCUMENTS

JP        63067749 A   *   3/1988   ................. 257/759

OTHER PUBLICATIONS

J. Fjelstad, "Wafer Level Packaging of Compliant CSPs Using Flexible Film Interposers", HDI Magazine, Spring 1999, 6 pages.

* cited by examiner

*Primary Examiner*—Eddie Lee
*Assistant Examiner*—Chris C. Chu
(74) *Attorney, Agent, or Firm*—Ann M. Agosti; Jill M. Breedlove (57) ABSTRACT

One type of electronic interface structure includes a base; at least one elastomeric island supported by the base; and patterned metallization overlying the at least one elastomeric island and including at least one floating pad at least partially overlying the at least one elastomeric island. Another type of electronic interface structure includes a base; a first dielectric layer overlying the base and having at least one first dielectric layer opening therein; a second dielectric layer overlying the first dielectric layer; and patterned metallization overlying the second dielectric layer and including at least one floating pad at least partially overlying the at least one opening.

17 Claims, 9 Drawing Sheets

ELECTRONIC INTERFACE STRUCTURES AND METHODS OF FABRICATION

BACKGROUND

The invention relates generally to electrical interconnections and more particularly to electronic interface structure fabrication methods.

Ball grid array (BGA) technology provides a high density of interconnections per unit area, but mismatches of coefficients of thermal expansion (CTEs) occur when ceramic or polymer BGA substrates and printed circuit boards are joined and often result in cracked solder joints, especially as the size of the substrates and temperature ranges are increased. In column grid array (CGA) techniques and other BGA techniques, a eutectic solder is applied to printed circuit board and multi-chip module array pads and the resulting joint is soldered to a higher temperature solder column or ball which does not melt. Both BGA and CGA structures can be inflexible and vulnerable to damage. For various types of BGA and CGA, increases in reliability are attempted by elaborate under-filling of the structures with polymer glues to reinforce the interfaces and reduce the effects of the CTE mismatch on the solder joints. The polymer glues, however, impair repairability because of the difficulty in removing the glues after hardening. Furthermore, these types of structures require two separate solder steps, are more expensive than conventional solder structures, and require more vertical space due to increased height of the joints.

One conventional micro ball grid array interface technique for attaching a semiconductor circuit chip directly to a substrate is to use a series of solder bumps clustered at the center of the chip to constrain the area over which stresses between differing coefficients of thermal expansion occur. In this embodiment, chips have their pads reconfigured and solder micro bumps are applied over the reconfigured pads. In one embodiment, ball grid array processes are used with the temperature range being constrained during device operation to 30° C. to 70° C. in an effort to avoid CTE stress effects. In another ball grid array interface technique, the area where the chip faces the printed circuit board or substrate is not used for direct interconnection. Instead, metallization is routed from the chip to adjacent support structures which then have solder ball connections. This technique can create size and pin count limitations as well as electrical parasitic effects.

Commonly assigned Wojnarowski et al., U.S. Pat. No. 5,900,674, describes an interface including a surface having an electrically conductive pad; a compliant coating over the surface having a via extending to the pad; metallization patterned over the compliant coating and extending into the via; a low modulus dielectric interface layer overlying the compliant coating and having an interface via extending to the metallization; and a floating pad structure including floating pad metallization patterned over the dielectric interface layer with a first portion forming a central pad and a second portion forming an extension from the central pad extending into the interface via. The "floating pad" structure is used to increase reliability by providing stress and thermal accommodation of the two materials and permitting movement of the floating pad independent of the base pad. The extension provides stress relief for different coefficients of thermal expansion. The floating pad interface structures can include a single pad and extension or several extensions in situations wherein a single extension is not sufficient for extreme thermal stress/strain situations. The resulting structure accommodates thermal and material stresses without submitting the via interconnect areas to forces that can crack vias or break connections at the pads. The floating pads permit movement independent of a base surface underlying the pads while providing electrical interconnections through selected materials that are specifically patterned to provide low forces at the via areas and thus accommodate differential thermal stresses which may be caused by large CTE differences.

Commonly assigned Wojnarowski et al., U.S. Pat. No. 5938,452 describes a more flexible interface structure for electronic devices that does not require an underlying base surface and that can be used for relieving stress from structures such as multi-chip modules (MCMs), wafers, individual dies or chips, microelectromechanical structures (MEMs), printed circuit boards, and surface mount technologies which may be caused from coefficient of thermal expansion mismatches with connections such as those formed by ball grid arrays, micro ball grid arrays, column grid arrays, flip chips, solder joints, or tape automated bonding connections. In one embodiment, a film interface includes a film; flexible material attached to a portion of the film; and surface metallization on the flexible material. The film has at least one via extending therethrough to the surface metallization. A floating pad structure including floating pad metallization patterned over the flexible material and the surface metallization has a first portion forming a central pad and a second portion forming at least one extension from the central pad and extending into the at least one via.

The floating pad embodiments of aforementioned U.S. Pat. Nos. 5,900,674 and 5,938,452 can extend solder attach life by a factor of about ten. However, the fabrication sequences involve complex deposition and via formation processes and are therefore expensive.

SUMMARY

It would therefore be desirable to have an electronic interface structure with a simplified fabrication sequence as compared with fabrication sequences of present electronic interface structures.

In accordance with one embodiment of the present invention, an electronic interface structure includes a base; at least one elastomeric island supported by the base; and patterned metallization overlying the at least one elastomeric island and including at least one floating pad at least partially overlying the at least one elastomeric island.

In accordance with another embodiment of the present invention, an electronic interface structure includes a base; a first dielectric layer overlying the base and having at least one first dielectric layer opening therein; a second dielectric layer overlying the first dielectric layer; and patterned metallization overlying the second dielectric layer and including at least one floating pad at least partially overlying the at least one opening.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTION

FIGS. 1–15 relate to embodiments of the present invention wherein an electronic interface structure fabrication method comprises applying patterned metallization 22 over at least one elastomeric island 18 supported by a base 10 including at least one floating pad 24 at least partially overlying the elastomeric island. The word "supported" is intended to cover situations wherein the island is within the base, directly on top of the base, and/or on top of any material overlying the base. Although the figures generally show single floating pads for purposes of illustration, in practice large arrays of floating pads can be simultaneously formed on a common base.

Figure 1:
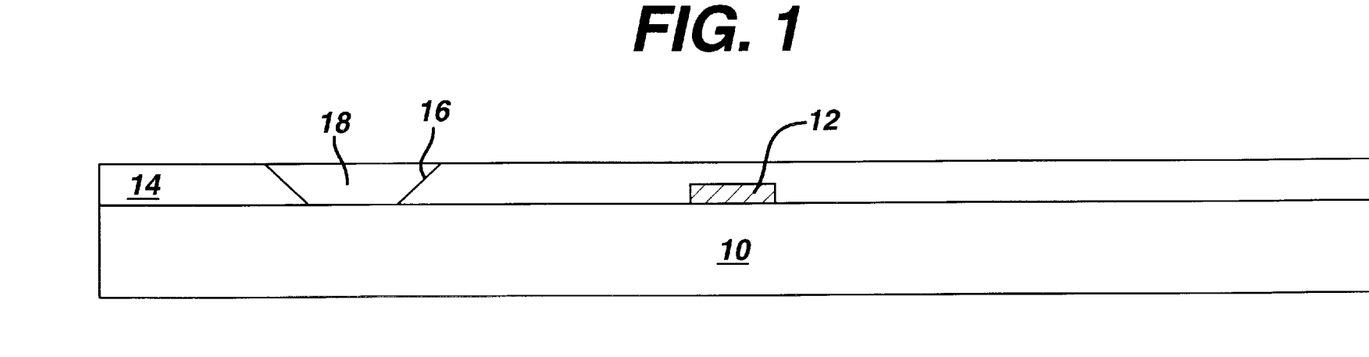
FIGS. 1–2 are sectional side views of fabrication stages of one embodiment of the present invention wherein an elastomeric island is formed within a dielectric layer.
Figure 2:
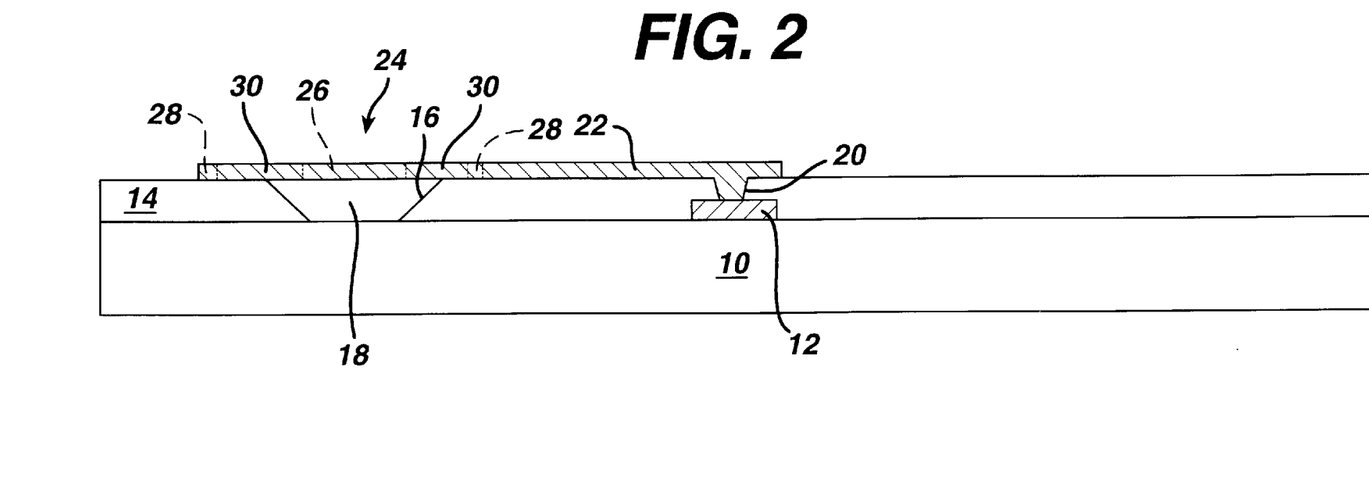
Figure 3:
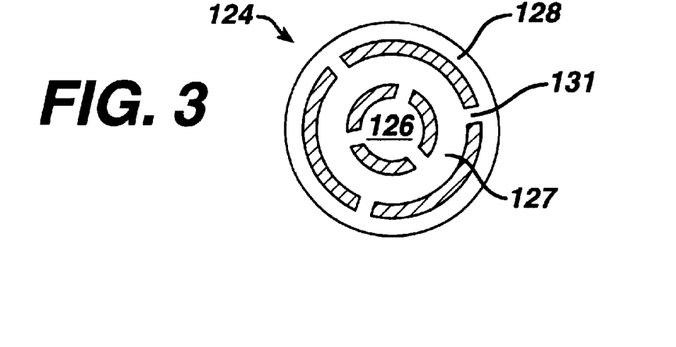
FIGS. 3–5 are top views of floating pad embodiments that can be used with any of the embodiments of FIGS. 1–2 and 6–19.
Figure 4:
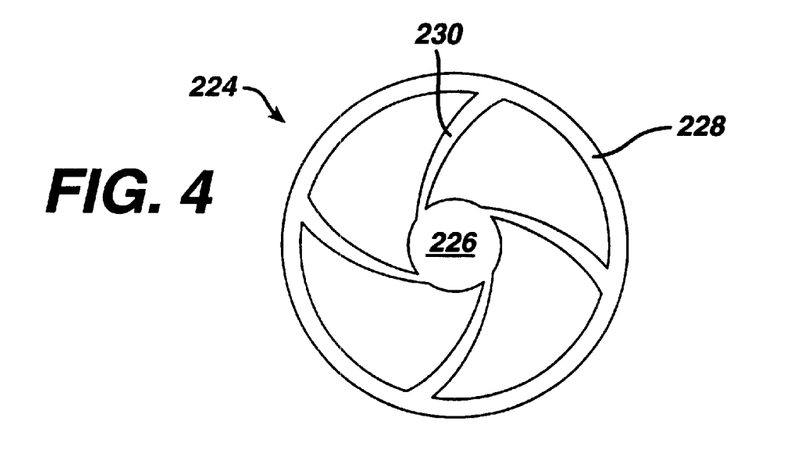
Figure 5:
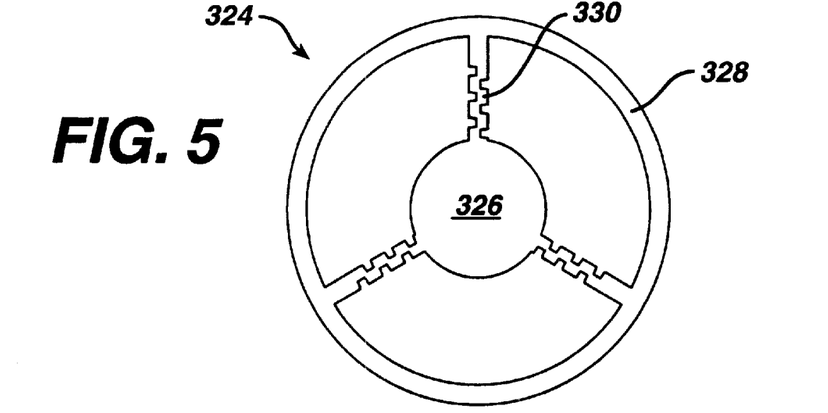

FIGS. 1–2 are sectional side views of fabrication stages of one embodiment of the present invention wherein elastomeric island 18 is formed within a dielectric layer 14, and FIGS. 3–5 are top views of floating pad 24 embodiments that can be used with any of the embodiments of FIGS. 1–2 and 6–19.

In the embodiment of FIG. 1, base 10 includes at least one electrical contact pad 12. A dielectric layer 14 is applied over the base and the at least one electrical contact pad, at least one opening 16 is provided in the dielectric layer, the elastomeric island 18 is formed in the at least one opening, and at least one via 20 is provided in the dielectric layer to extend to the at least one electrical contact pad. Metallization 22 is then applied over the surface of the dielectric layer 14 and patterned such that the metallization 22 extends into the at least one via and over the at least one elastomeric island 18.

Base 10 may comprise a semiconductor wafer that has not yet been cut into segmented individual chips or a chip which has been segmented from a wafer. Processing on a wafer that has not yet been segmented enables mass fabrication of interface structures and prevents single chip handling problems such as corner edge separations of the compliant coating and alignment difficulties associated with single die handling for photolithographic processing. Base 10 may alternatively comprise, for example, a passive component, a chip package, a multichip package, a printed circuit (PC) board, a multi-chip module (MCM), a flexible interconnect layer structure such as described in Cole et al., U.S. Pat. No. 5,527,741, or a substrate or wafer including photonic structures, liquid crystal structures, or microelectromechanical structures (MEMS), for example. Contact pads 12 may comprise pads or metallization on any of the above-discussed bases.

Dielectric layer 14 typically comprises a polymer material such as a polyimide and has a thickness ranging from about 10 micrometers to about 100 micrometers, for example. Dielectric layer 14 can be deposited on base 10 by spin, spray, or extrusion coating, for example, or can be laminated onto base 10 with heat and/or an adhesive (not shown).

Openings 16 are formed in dielectric layer 14 by any appropriate method in the areas where floating pads 24 will be situated. In one embodiment, the dielectric layer can be scanned repeatedly with a high energy, continuous wave laser to create openings of desired size and shape. Other appropriate methods include, for example, photopatterning photopatternable polyimides and using an excimer laser with a mask (not shown). Openings 16 may extend completely through dielectric layer 14, as shown, or partly through dielectric layer 14.

In one embodiment, after dielectric layer 14 is cured, elastomeric island 18 is formed by coating the dielectric layer with a polymer such as siloxane polyimide epoxy, for example, and photo-curing the polymer to form the at least one opening of the dielectric layer. Elastomeric island 18 can be deposited by any one of a number of methods. One method is using a squeegee to spread liquid polymer over the surface and deposit it into each opening. A second deposition method involves the use of a squeegee with a stencil that has openings within the stencil that are aligned to the openings 16 in dielectric layer 14, which would be able to dispense additional material into each opening 16 and to avoid having residue polymer material onto the surface of dielectric layer 14. A third deposition method is to use a pump-actuated dispense nozzle to inject a selected volume of liquid polymer into each opening 16. A fourth deposition method includes using an ink jetting system to shoot droplets of liquid polymer into each opening 16.

The deposited liquid elastomeric island material can be cured by using one of a number of standard polymer curing methods such as thermal curing, photocuring or microwave curing or by a combination of these methods. Residue liquid material that is inadvertently dispensed onto areas of dielectric layer 14 can be either removed by a solvent wash or left in place to become an integral part of the dielectric layer 14.

Referring to FIG. 2, vias 20 are formed in dielectric layer 14 to extend to respective electrical contact pads 12. In one embodiment, the vias are formed by laser ablation.

Then patterned metallization 22 is applied. Patterned metallization can be applied either by depositing a blanket layer of metallization over the interface structure (by sputtering and/or plating, for example) and then patterning the metallization with a standard photoresist and etch process or by a single step of depositing the metallization directly in the desired pattern such as by using an adaptive lithography system. Metallization 22 in one embodiment comprises a thin adhesion layer of 1000 Å sputtered titanium, coated by a thin layer of 3000 Å sputtered copper, coated by a layer of electroplated copper to a thickness of four microns, for example. An optional buffer layer of 1000 Å of titanium can be applied over the electroplated copper. Other example metallization materials include molybdenum, tungsten, and gold. The appropriate material of the metallization will vary depending on the materials of base 10 and contact pads 12 and on the environment, such as a high temperature environment or an oxidizing environment for example, in which the interface structure will be used. The thickness of the plated copper within the patterned metallization 22 varies based upon the current requirement of the electrical circuit, with a thickness in the range of about 1 to about 4 micrometers for lower current levels such as about 0.1 amps or less, to a thickness in the range of about 10 to about 50 microns for higher currents such as about 1 amp or more.

The size of central pads 26 will vary according to the specific planned use of the floating pad structure. For example, if a solder ball or solder bump will be attached directly to the central pad, the central pad must be large enough to accommodate the attachment. The size of the central pad will also affect the length of extensions. Smaller diameter central pads require less space than larger diameter pads and therefore leave more space for longer extensions.

The thickness of metallization for the floating pad structures can be uniform, as shown, or variable, as described in aforementioned U.S. Pat. Nos. 5,900,674 and 5,938,452, for example, wherein a modified central pad includes an additional metallization area. In one embodiment, the extensions have a thickness ranging from about 2 microns to about 8 microns, and the central pad has a thickness ranging from about 4 microns to about 20 microns. This embodiment is useful because thin extensions are more flexible than thicker extensions whereas the central pad is preferably sufficiently thick to be solderable to another electrically conductive surface.

In one embodiment, applying patterned metallization 22 includes patterning at least one floating pad 24 to include a central pad 26 overlying the at least one elastomeric island 18, an outer ring 28 overlying dielectric layer 14, and at least one extension 30 coupling the central pad and the outer ring. In this embodiment, the central pad is mechanically isolated from the underlying base 10. Extensions 30 may be planar or may include dip portions (not shown) as described in aforementioned U.S. Pat. Nos. 5,900,674 and 5,938,452 for reducing mechanical stress on the extensions.

The top views of FIGS. 3–5 are for purposes of example only. In FIG. 3, floating pad 124 includes an additional ring 127 between central pad 126 and ring 128 with additional extensions 131 for further stress relief. In FIG. 4, floating pad 224 includes four curved extensions 230 between central pad 226 and ring 228. In FIG. 5, floating pad 324 includes serpentine shaped extensions 330 between central pad 326 and ring 328.

The above described example embodiment of FIGS. 1–5 includes only two deposition sequences, one metallization sequence, and one via formed per contact pad connection and is thus simpler than the aforementioned U.S. Pat. Nos. 5,900,674 and 5,938,452. If desired, in the embodiments described above, as well as in the embodiments described below, passivation material (not shown) such as a polymeric dielectric material or a solder mask material can be applied to the surface of patterned metallization 22 to protect the patterned metallization.

FIGS. 6–11 are sectional side views of fabrication stages in other embodiments of the present invention wherein an elastomeric island 118 is formed on a dielectric layer 14. In these embodiments, base 10 again optionally includes at least one electrical contact pad 12.

The dielectric layer 14 is applied over the base and the at least one electrical contact pad, at least one via 20 is provided in the dielectric layer and extends to the at least one electrical contact pad, and the at least one elastomeric island 18 is applied over the dielectric layer. Metallization 22 is then applied over the surface of the dielectric layer 14 and onto the at least one elastomeric island 118 and patterned such that the metallization 22 extends into the at least one via and over the at least one elastomeric island 18.

Figure 6:
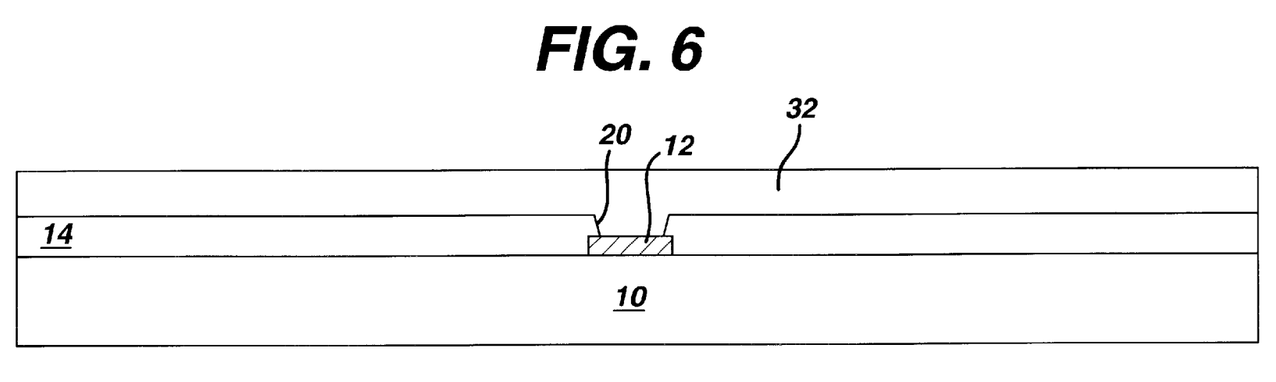
FIGS. 6–11 are sectional side views of fabrication stages in other embodiments of the present invention wherein an elastomeric island is formed on a dielectric layer.
Figure 7:
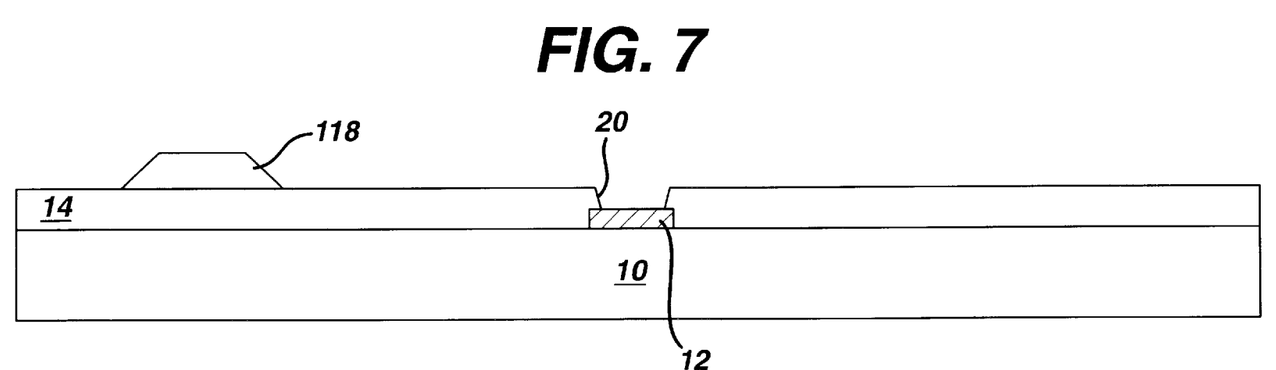
Figure 8:
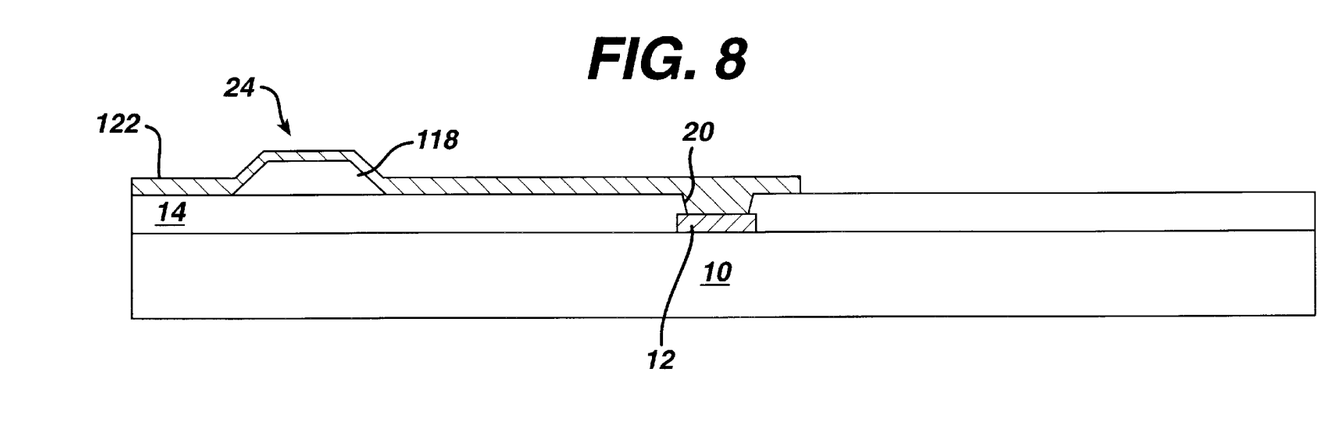

Unlike the embodiment of FIGS. 1–2, in the embodiments of FIGS. 6–11, dielectric layer 14 is not patterned to include openings 16. Instead, a layer of elastomeric material 32 (FIG. 6) is applied over the dielectric layer and patterned to provide at least one elastomeric island 118 over dielectric layer 14 and base 10. In the embodiment of FIGS. 6–8, vias 20 can be formed prior to or subsequent to patterning of elastomeric islands 118 (FIG. 7) and metallization 122 (FIG. 8) can then be applied as discussed above.

Figure 9:
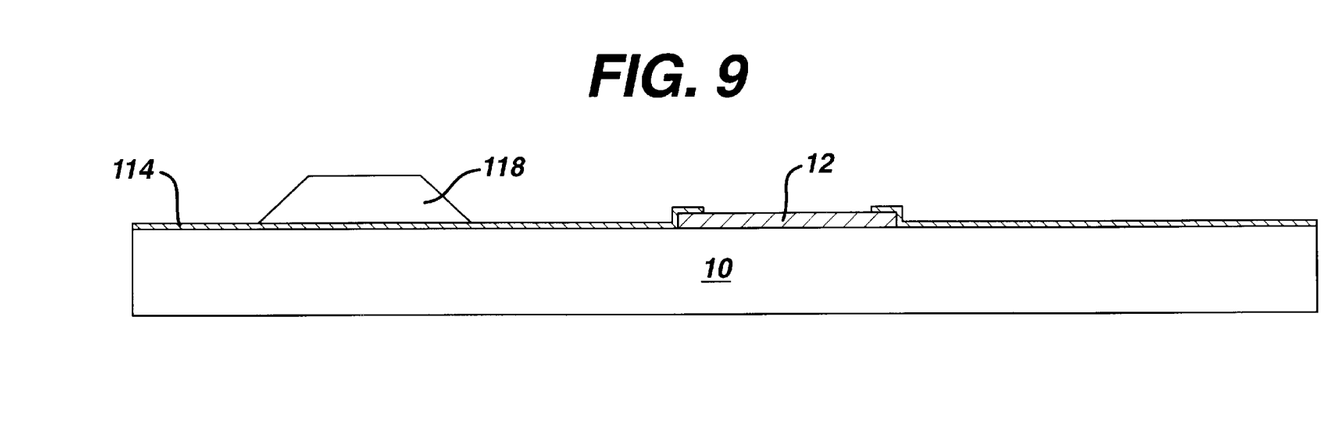
Figure 10:
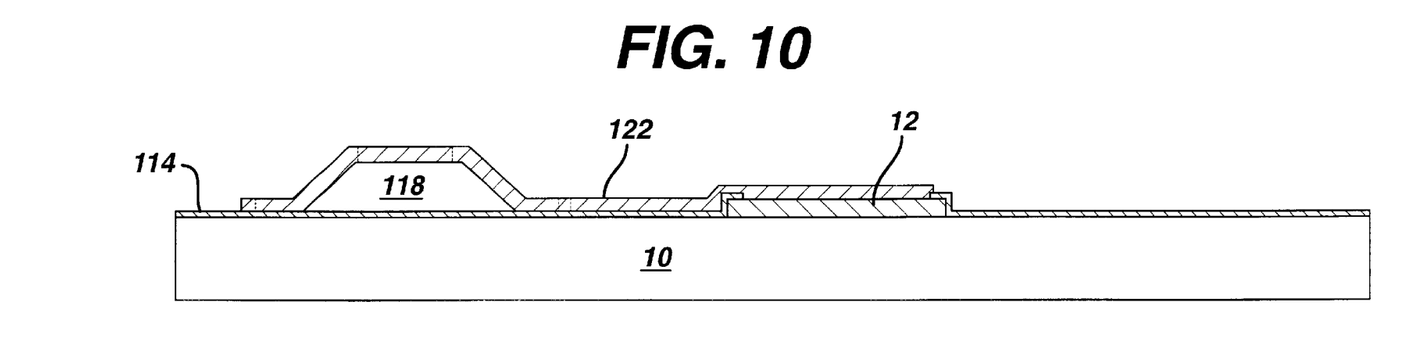

The embodiment of FIGS. 9–10 is similar to that of FIGS. 7–8 except that dielectric layer 114 comprises a passivation layer including an inorganic dielectric material such as silicon nitride, silicon dioxide, or amorphous hydrogenated carbon. Depending on the material of base 10, dielectric layer 114 can be grown on the surface of base 10 without growing on the electrical contact pads 12. In this situation, "vias" will be provided for the contact pads without a separate laser ablation step. Alternatively, dielectric layer 114 can be grown over the entire surface and later patterned using standard photomask and etch processes to form the openings over the contact pads 12. Inorganic dielectric layers have better dielectric breakdown characteristics and are less prone to pin hole openings than organic dielectric layers and can therefore be applied with reduced thicknesses (such as in the range of about 200 Å to about 5000 Å, for example).

Figure 11:
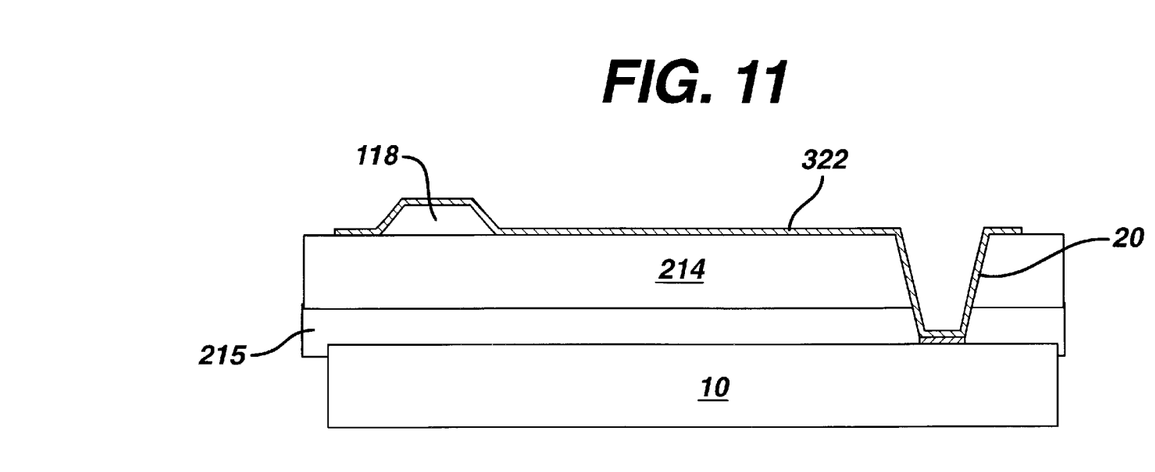

In the embodiment of FIG. 11, base 10 comprises a circuit chip and dielectric layer 214 comprises a flexible interconnect layer. The circuit chip and flexible interconnect layer are coupled by adhesive 215, via 20 extends through the flexible interconnect layer, and patterned metallization 322 forms the floating pad and electrical contact connections. The elastomeric island 118 is formed in the same manor as shown in FIG. 7 on the flexible interconnect layer either prior to the bonding of the flexible interconnect layer onto the base 10 or after the bonding.

FIGS. 12–15 are sectional side views of fabrication stages in other embodiments of the present invention where an interface structure is fabricated that can be added to commercial area array devices to provide the advantages of the above described embodiments of this invention. In this embodiment at least one through hole 50 is provided to extend through base 10 that may comprise a number of materials such as polyimides or polytetrafluoroethelynes (FTFEs), or a composite material made out of a combination of these materials, for example. The flexible structure could be as thin as 10 micrometers or less, or as thick as 100 micrometers or more. Metallization 222 is patterned on multiple surfaces of base 10 and through the at least one through hole.

Figure 12:
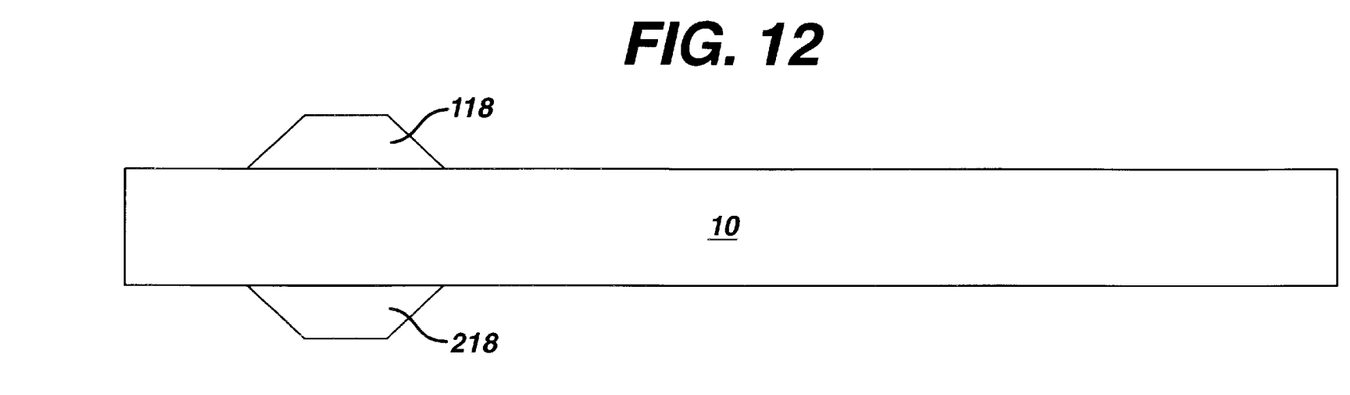
FIGS. 12–15 are sectional side views of fabrication stages in other embodiments of the present invention where metallization is patterned on multiple surfaces.

As shown in FIG. 12, a plurality of elastomeric islands can be formed on both surfaces of the base with each being formed using the process described with respect to FIGS. 6 and 7, for example. In one embodiment, a first elastomeric island 118 is applied on an opposing side of the base and across from a second elastomeric island 218. Typically the upper elastomeric island 118 will be aligned to the lower elastomeric island 218. This alignment facilitates the use of the interface structure on an area array device that would be mounted down onto a circuit board or substrate that has a matching area array of contact pads. Although other alignments of the elastomeric islands 118 and 218 are possible and may be useful in certain applications, the alignment shown in FIGS. 12–14 is directly applicable to existing area array devices and board pad layouts.

Figure 13:
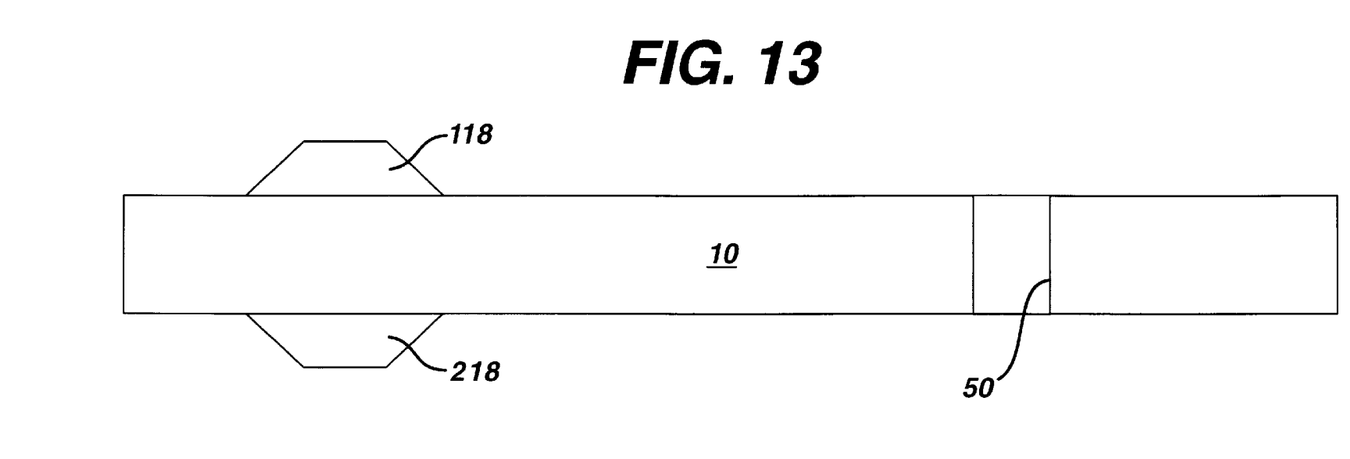
Figure 14:
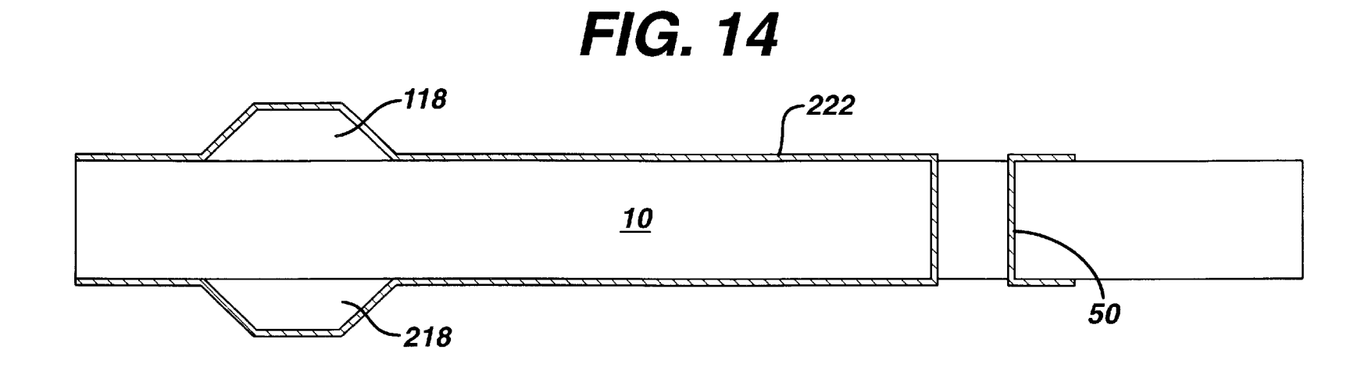

FIG. 13 illustrates a through hole 50 that is formed through base 10, and FIG. 14 illustrates patterned metallization 222 on both surfaces of the base coupled via through hole 50. Base 10 may include through holes prior to application of elastomeric islands 118 and 218, or depending on the material of base 10, through holes can be provided after application of the elastomeric islands. If base 10 comprises a flexible interconnect layer or other material that can be ablated or etched, processes such as laser ablation, plasma etching, or chemical etching can be used to form the through holes. Through holes 50 can be situated close to (about 50 to about 100 micrometers) or farther away (about 2–5 millimeters or farther) from the floating pad, for example.

Elastomeric islands 118 and 218 may be formed sequentially or simultaneously. In a sequential process, a layer of elastomeric material 32 (FIG. 6) is applied on one side of base 10 and patterned to provide at least one elastomeric island 118 on base 10. This would be followed by repeating these process steps on the other side of base 10. In the alternative process, the two elastomeric islands 118 and 218 would be formed in parallel. In the parallel process, first one side of the base 10 is coated with a layer of elastomeric material 32 (FIG. 6) followed by coating the second side. This is followed by one side being patterned to provide at least one elastomeric island 118 then repeating the patterning step on the other side of the base 10.

In one embodiment, metallization 222 is applied to both sides and to the through holes. This can be done by electroplating, electroless plating or other metallization techniques. The metallization 222 is photopatterned by applying photoresist (not shown) over the top and bottom surfaces of the structure and in or over the through holes 50. The photoresist is pattern developed by exposing predetermined areas of the photoresist to a UV or visible light source, either with a direct write laser system or with a laser or light source that exposes selected areas through a mask such as a metal mask. The developed photoresist is then used as an etch mask for a chemical metal etch back process leaving metal in through holes 50 and on selected areas of the surfaces to form the floating pads and interconnection lines. Either side of the resulting electronic interface structure of FIG. 14 can then be attached to a component (not shown) such as a packaged device or multichip module via solder or a conductive adhesive, for example. The opposite side would be used to attach the interface structure and its attached device to a board or substrate. This structure not only provides a method of applying the floating pads to existing area array devices but provides the stress relieving compliance of two sets of elastomeric islands 118 and 218.

Figure 15:
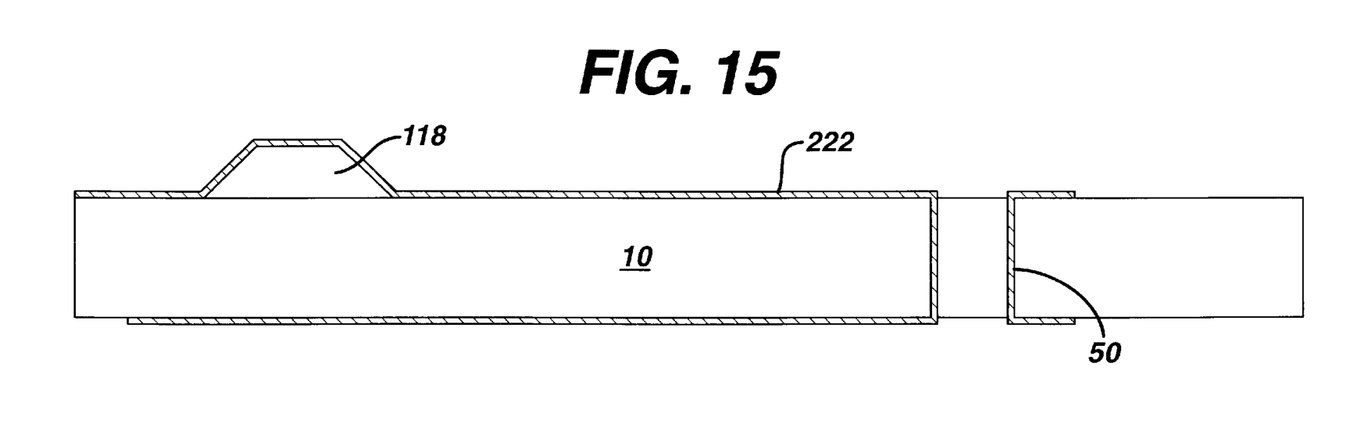

In the embodiment of FIG. 15, elastomeric islands 118 are formed on only one side of the base 10. Through holes 50 are formed through base 10. The top and bottom surfaces of the base 10 and the through holes 50 are metallized and patterned leaving patterned metallization 222 on the surfaces of base 10 and through hole 50, and elastomeric islands 118. The patterned metallization 222 forms a contact pad on the bottom of the base 10 that is aligned under the top elastomeric island 118. In one attachment method of this embodiment the elastomeric island side of the resulting interface structure can be attached to an area array device and the other side of the interface structure can be attached to a mating board or substrate.

FIGS. 16–19 are sectional side views of fabrication stages in other embodiments of the present invention wherein a floating pad is formed on a dielectric layer overlying an opening.

Figure 16:
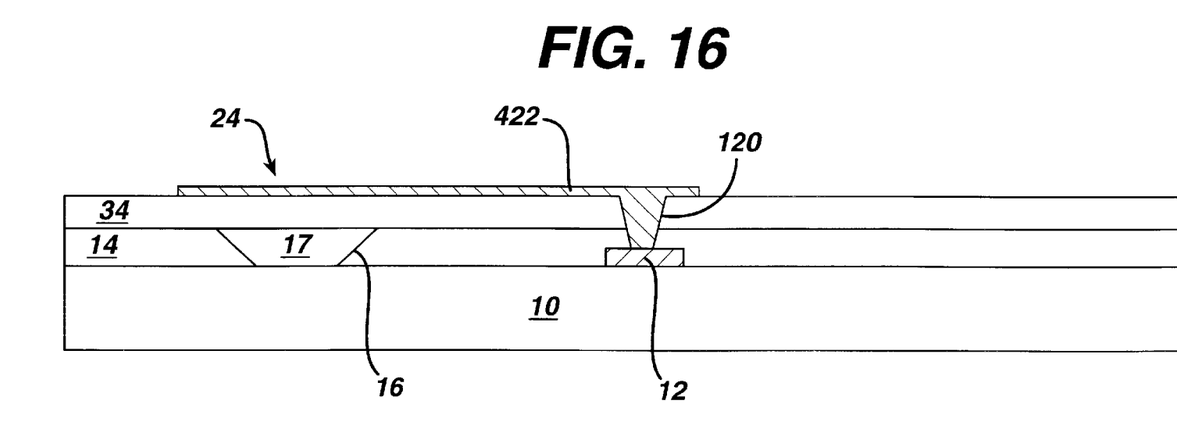
FIGS. 16–19 are sectional side views of fabrication stages in other embodiments of the present invention wherein a floating pad is formed on a dielectric layer overlying an opening.

In this embodiment, dielectric layer 14 can be formed on base 10 and opening 16 can be provided in a similar manner as discussed with respect to FIG. 1. A second dielectric layer 34 overlies first dielectric layer 14. Second dielectric layer 34 can be formed by laminating a thin polymer film over the surface of first dielectric layer 14 and bridging the opening 16. Metallization 422 is applied and patterned over the second dielectric layer to include at least one floating pad 24 at least partially overlying opening 16.

If desired, an elastomeric island or other flexible material can be added in the resulting areas 17 of openings 16. In such embodiments elastomeric material is deposited into the opening 16 in the same manor as in FIG. 1. Metallization 120 is applied and patterned as in FIGS. 1–2. Additionally, in such embodiments second dielectric layer 34 can optionally be applied by techniques such as spin coating, spray coating or extrusion coating.

In one embodiment, base 10 includes at least one electrical contact pad 12, and at least one via 120 is provided to extend through the first and second dielectric layers to the at least one electrical contact pad. Patterned metallization 422 includes metallization extending into the at least one via.

Figure 17:
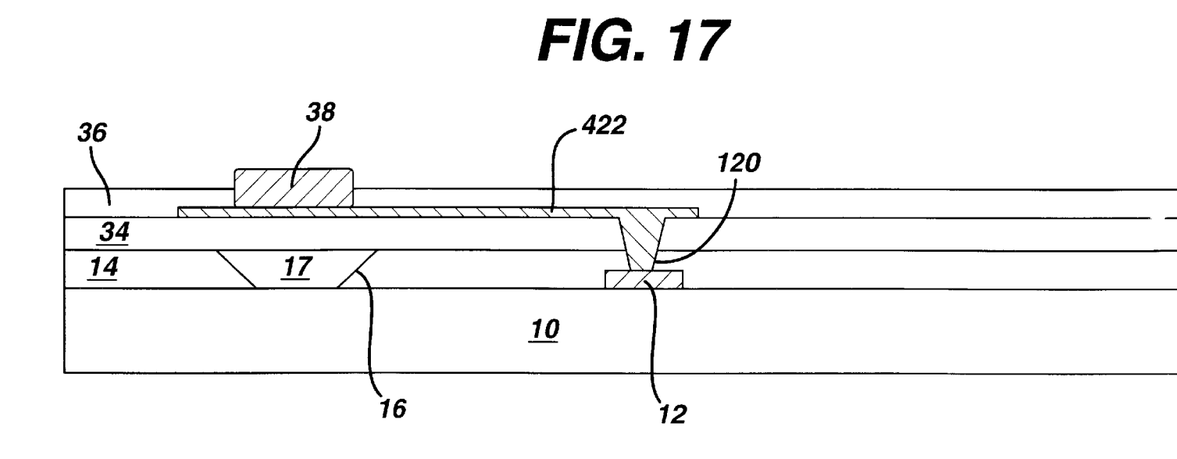

As shown in FIG. 17, a solder mask 36 can be applied over the second dielectric layer and the patterned metallization with a solder mask opening over at least a portion of the central pad. Solder 38 can be used in the solder mask opening for attachment of the interface structure.

Figure 18:
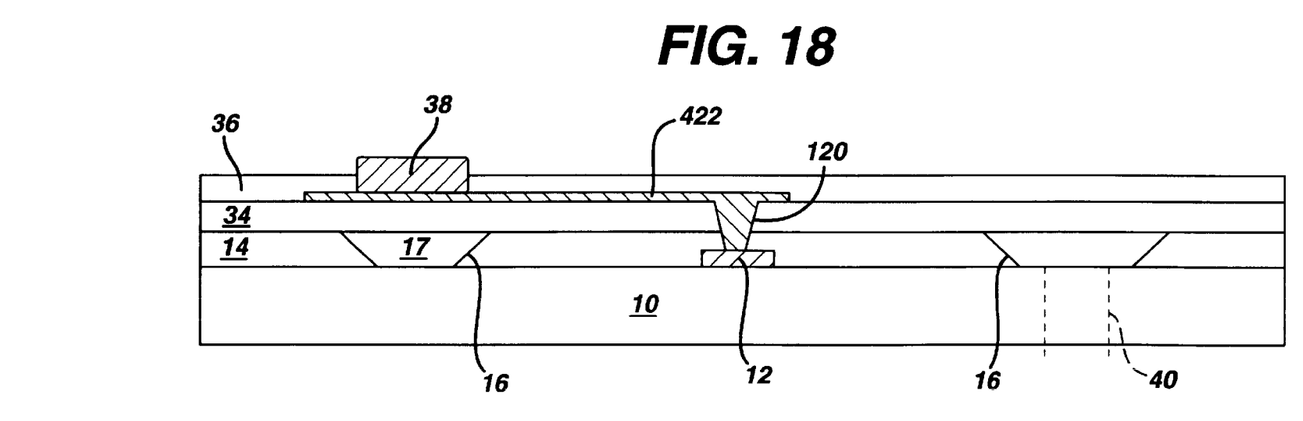
Figure 19:
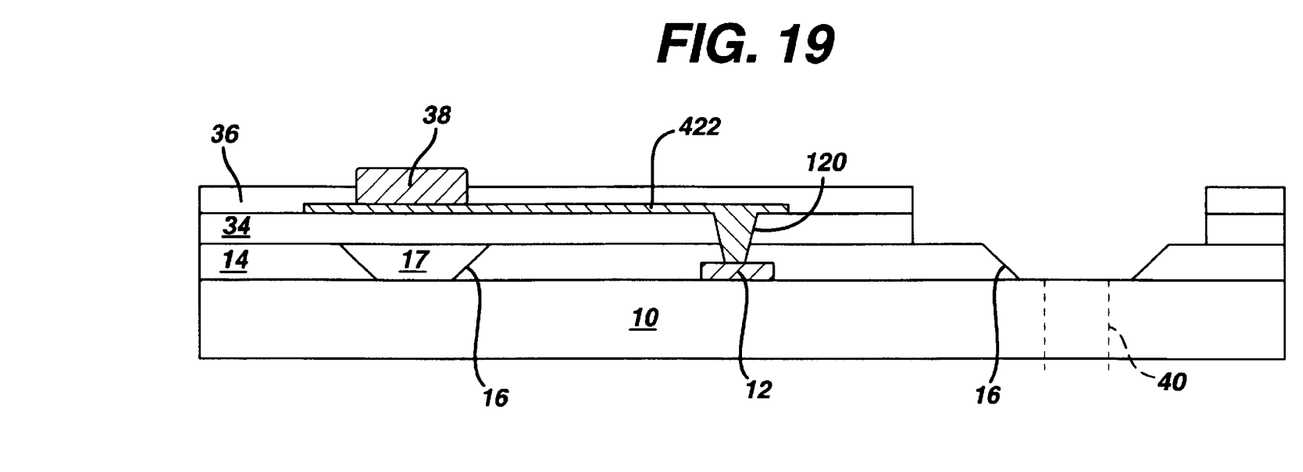

FIGS. 18–19 illustrate an option that can be used to simplify separation of base 10, particularly if base 10 comprises a semiconductor wafer. In the embodiment of FIG. 18, at the same time that openings 16 are being formed in dielectric layer 14, openings 116 can be formed over wafer scribe lanes 40. Later, as shown in FIG. 19, solder mask 36 and second dielectric layer 34 can be removed to expose wafer scribe lane 40. Removal of the dielectric layer 34 can be accomplished by the same processes that are used to form vias 120, such as laser ablation or with a mask based etch process. This embodiment facilitates sawing of wafer scribe lanes without interference from overlying dielectric layers. This same process of opening the regions between die sites can be applied to any of the structures depicted in FIGS. 1–2 and 6–17.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An electronic interface structure comprising:
   a base including at least one electrical contact pad;
   a dielectric layer overlying the base and the at least one electrical contact pad and having at least one opening therein and at least one via therein with the at least one via extending to the at least one electrical contact pad;
   at least one elastomeric island supported by the base and situated in the at least one opening; and
   patterned metallization overlying the at least one elastomeric island and extending into the at least one via and including at least one floating pad at least partially overlying the at least one elastomeric island.

2. The structure of claim 1 wherein the base is a dielectric layer, a flexible interconnect layer, a printed circuit board, a circuit chip, a chip package, a multichip package, or a semiconductor wafer.

3. The structure of claim 1 wherein the at least one floating pad includes a central pad overlying the at least one elastomeric island, an outer ring overlying the dielectric layer, and at least one extension coupling the central pad and the outer ring.

4. The structure of claim 3 wherein the base is a flexible interconnect layer, a printed circuit board, a circuit chip, a chip package, a multichip package, or a semiconductor wafer.

5. An electronic interface structure comprising:

a base including at least one electrical contact pad;

a dielectric layer overlying the base and the at least one electrical contact pad and having at least one via therein with the at least one via extending to the at least one electrical contact pad;

at least one elastomeric island supported by the base and overlying the dielectric layer;

patterned metallization overlying the at least one elastomeric island and extending into the at least one via and including at least one floating pad at least partially overlying the at least one elastomeric island.

6. The structure of claim 5 wherein the at least one floating pad includes a central pad overlying the at least one elastomeric island, an outer ring overlying the dielectric layer, and at least one extension coupling the central pad and the outer ring.

7. The structure of claim 5 wherein the dielectric layer comprises a polymer layer, or passivation layer, or an interconnect layer.

8. The structure of claim 5 wherein the base comprises a circuit chip and the dielectric layer comprises a flexible interconnect layer.

9. An electronic interface structure comprising:

a base having a through hole extending therethrough;

at least one elastomeric island supported by and overlying the base; and patterned metallization overlying the at least one elastomeric island and both surfaces of the base, extending through the at least one through hole, and including at least one floating pad at least partially overlying the at least one elastomeric island.

10. The structure of claim 9 wherein the at least one floating pad includes a central pad overlying the at least one elastomeric island, an outer ring overlying the dielectric layer, and at least one extension coupling the central pad and the outer ring.

11. The structure of claim 10 wherein the at least one elastomeric island comprises a plurality of elastomeric islands situated on both surfaces of the base.

12. The structure of claim 11 wherein a first elastomeric island is situated on an opposing side of the base and across from a second elastomeric island.

13. An electronic interface structure comprising:

a base including at least one electrical contact pad;

a first dielectric layer overlying the base and having at least one first dielectric layer opening therein;

a second dielectric layer overlying the first dielectric layer and the at least one first dielectric layer opening, the first and second dielectric layers having at least one via extending therethrough to the at least one electrical contact pad; and patterned metallization overlying the second dielectric layer, extending into the at least one via, and including at least one floating pad at least partially overlying the at least one opening, the at least one floating pad including a central pad overlying the at least one opening, an outer ring overlying the first and second dielectric layers, and at least one extension coupling the central pad and the outer ring.

14. The structure of claim 13 further including a solder mask overlying the second dielectric layer and the patterned metallization and having a solder mask opening over at least a portion of the central pad.

15. The structure of claim 14 wherein the base comprises a wafer and the at least one first dielectric layer opening comprises at least two dielectric openings with at least one of the at least two dielectric openings being situated over a wafer scribe lane.

16. The structure of claim 13 wherein the base comprises a wafer and the at least one first dielectric layer opening comprises at least two dielectric openings with at least one of the at least two dielectric openings being situated over a wafer scribe lane.

17. An electronic interface structure comprising:

a base;

a first dielectric layer overlying the base and having at least one first dielectric layer opening therein;

elastomeric material situated in the at least one opening;

a second dielectric layer overlying the first dielectric layer and the at least one first dielectric layer opening; and patterned metallization overlying the second dielectric layer and including at least one floating pad at least partially overlying the at least one opening.

* * * * *